United States Patent
Wu et al.

(10) Patent No.: US 11,396,694 B2
(45) Date of Patent: Jul. 26, 2022

(54) EVAPORATION CRUCIBLE AND EVAPORATION APPARATUS

(71) Applicants: BOE TECHNOLOGY GROUP CO., LTD., Beijing (CN); Chengdu BOE Optoelectronics Technology Co., Ltd., Sichuan (CN)

(72) Inventors: Jianpeng Wu, Beijing (CN); Yinan Liang, Beijing (CN); Fengli Ji, Beijing (CN); Chang Luo, Beijing (CN); Zhongying Yang, Beijing (CN)

(73) Assignees: BOE TECHNOLOGY GROUP CO., LTD., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 820 days.

(21) Appl. No.: 16/071,640

(22) PCT Filed: Jul. 18, 2017

(86) PCT No.: PCT/CN2017/093320
§ 371 (c)(1),
(2) Date: Jul. 20, 2018

(87) PCT Pub. No.: WO2019/014826
PCT Pub. Date: Jan. 24, 2019

(65) Prior Publication Data
US 2021/0172051 A1 Jun. 10, 2021

(51) Int. Cl.
*C23C 14/24* (2006.01)
*C23C 14/12* (2006.01)

(52) U.S. Cl.
CPC ............ *C23C 14/243* (2013.01); *C23C 14/12* (2013.01)

(58) Field of Classification Search
None
See application file for complete search history.

(56) References Cited

U.S. PATENT DOCUMENTS 9,227,203 B2 * 1/2016 Lee ...................... C23C 14/243
2007/0272156 A1 11/2007 Noh
(Continued)

FOREIGN PATENT DOCUMENTS

CN 101403092 A 4/2009
CN 103726030 A 4/2014
(Continued)

OTHER PUBLICATIONS

International Search Report & Written Opinion dated Apr. 16, 2018, regarding PCT/CN2017/093320.
(Continued)

*Primary Examiner* — Karla A Moore
(74) *Attorney, Agent, or Firm* — Intellectual Valley Law, P.C.

(57) ABSTRACT

The present application discloses an evaporation crucible including a crucible body and a plurality of nozzles connected to the crucible body. Each of the plurality of nozzles has an opening on a side distal to the crucible body. The plurality of nozzles include a first nozzle on a first edge of the plurality of nozzles. The first nozzle has a first height relative to a surface of the crucible body on a side proximal to the first edge greater than a second height relative to the surface of the crucible body on a side distal to the first edge.

19 Claims, 9 Drawing Sheets

(56) References Cited

U.S. PATENT DOCUMENTS

| | | |
|---|---|---|
| 2008/0305246 A1 | 12/2008 | Choi et al. |
| 2009/0025885 A1 | 1/2009 | Buschbeck et al. |
| 2012/0107504 A1 | 5/2012 | Maurer et al. |
| 2012/0141674 A1* | 6/2012 | Park ................. C23C 14/243 427/248.1 |
| 2013/0240870 A1* | 9/2013 | Kawato ............... C23C 14/12 257/40 |
| 2016/0260934 A1* | 9/2016 | Liu .................. H01L 51/0021 |
| 2017/0175250 A1 | 6/2017 | Hu |

FOREIGN PATENT DOCUMENTS

| | | |
|---|---|---|
| CN | 105112856 A | 12/2015 |
| CN | 205368487 U | 7/2016 |
| JP | 2009228098 A | 10/2009 |

OTHER PUBLICATIONS

First Office Action in the Chinese Patent Application No. 201780000629.8, dated Sep. 30, 2020; English translation attached.

* cited by examiner

US 11,396,694 B2

EVAPORATION CRUCIBLE AND EVAPORATION APPARATUS

CROSS-REFERENCE TO RELATED APPLICATION

This application is a national stage application under 35 U.S.C. § 371 of International Application No. PCT/CN2017/093320, filed Jul. 18, 2017, the contents of which are incorporated by reference in the entirety.

TECHNICAL FIELD

The present invention relates to an evaporation crucible and an evaporation apparatus.

BACKGROUND

In a process of making an organic light emitting diode (OLED), the organic light emitting material is evaporated onto a substrate using an evaporation crucible. Specifically, the organic light emitting material is placed inside the evaporation crucible having a heating source. When power is applied to the heating source, the organic light emitting material evaporates or sublimes into a vapor. The evaporated or sublimed vapor condenses when it reaches the substrate on top of the evaporation crucible. The organic light emitting material is deposited on the substrate.

SUMMARY

In one aspect, the present invention provides an evaporation crucible comprising a crucible body; and a plurality of nozzles connected to the crucible body, each of which has an opening on a side distal to the crucible body; wherein the plurality of nozzles comprises a first nozzle on a first edge of the plurality of nozzles; and the first nozzle has a first height relative to a surface of the crucible body on a side proximal to the first edge greater than a second height relative to the surface of the crucible body on a side distal to the first edge.

Optionally, the first nozzle has a first opening; and a plane of the first opening is inclined with respect to the cross-section of the first nozzle normal to the central axis of the first nozzle at a first angle in a range of approximately 5 degrees to approximately 85 degrees.

Optionally, the plurality of nozzles comprises a second nozzle on a second edge of the plurality of nozzles, the second edge being opposite to the first edge; and the second nozzle has a third height relative to the surface of the crucible body on a side proximal to the second edge greater than a fourth height relative to the surface of the crucible body on a side distal to the second edge.

Optionally, the second nozzle has a second opening; and a plane of the second opening is inclined with respect to the cross-section of the second nozzle normal to the central axis of the second nozzle at, a second angle in a range of approximately 5 degrees to approximately 85 degrees.

Optionally, the third height is substantially the same as the first height; and the fourth height is substantially the same as the second height.

Optionally, the plane of the first opening and the plane of the second opening are inclined toward each other so that the plane of the first opening and the plane of the second opening intersect on a side of the first opening and the second opening proximal to the crucible body; a plane normal to the plane of the first opening and a plane normal to the plane of the second opening are substantially parallel to each other; the plane of the first opening is inclined with respect to the cross-section of the first nozzle normal to the central axis of the first nozzle at a first angle in a range of approximately 5 degrees to approximately 85 degrees; the plane of the second opening is inclined with respect to the cross-section of the second nozzle normal to the central axis of the second nozzle at a second angle in a range of approximately 5 degrees to approximately 85 degrees; and the first angle and the second angle are substantially the same.

Optionally, the plurality of nozzles includes at least a third nozzle between the first nozzle and the second nozzle; the third nozzle has a substantially the same a fifth height relative to the surface of the crucible body on a side proximal to the first edge and on a side proximal to the second edge; the second height, the fourth height and the fifth height are substantially the same; and the third height is substantially the same as the first height.

Optionally, the third nozzle has a third opening; and the third nozzle has a substantially uniform height along an edge of the third opening.

Optionally, the third nozzle has a third opening; and a plane of the third opening is substantially normal to a central axis of the third nozzle.

Optionally, any nozzle between the first nozzle and the second nozzle has a substantially the same a sixth height relative to the surface of the crucible body on a side proximal to the first edge and on a side proximal to the second edge; the second height, the fourth height and the sixth height are substantially the same; and the third height is substantially the same as the first height.

Optionally, a plane of an opening of any nozzle between the first nozzle and the second nozzle is substantially normal to its central axis; and a plane normal to the plane of the first opening and a plane normal to the plane of the second opening are substantially parallel to each other, and substantially parallel to the central axes of nozzles between the first nozzle and the second nozzle.

Optionally, the first height is a maximal height along an edge of the first opening; and the second height is a minimal height along the edge of the first opening.

Optionally, the third height is a maximal height along an edge of the second opening; and the fourth height is a minimal height along the edge of the second opening.

Optionally, central axes of the plurality of nozzles are substantially parallel to each other.

Optionally, each of the plurality of nozzles has a cross-section normal to its central axis; and the cross-section of each of the plurality of nozzles has a substantially the same area.

Optionally, each of the plurality of nozzles comprises a single opening.

Optionally, a projection of each of the plurality of nozzles on the crucible body has a substantially the same shape and a substantially the same area.

Optionally, the projection of each of the plurality of nozzles on the crucible body has a circular shape.

In another aspect, the present invention provides an evaporation apparatus comprising an evaporation crucible described herein.

Optionally, the evaporation apparatus further comprises a housing; and a transporting apparatus in the housing; wherein the transporting apparatus is above the evaporation crucible and configured to support a substrate for receiving a vapor evaporated from the plurality of nozzles of the evaporation crucible; the plurality of nozzles are substantially arranged along a first direction; and the transporting apparatus is configured to move the substrate in a direction substantially perpendicular to the first direction.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
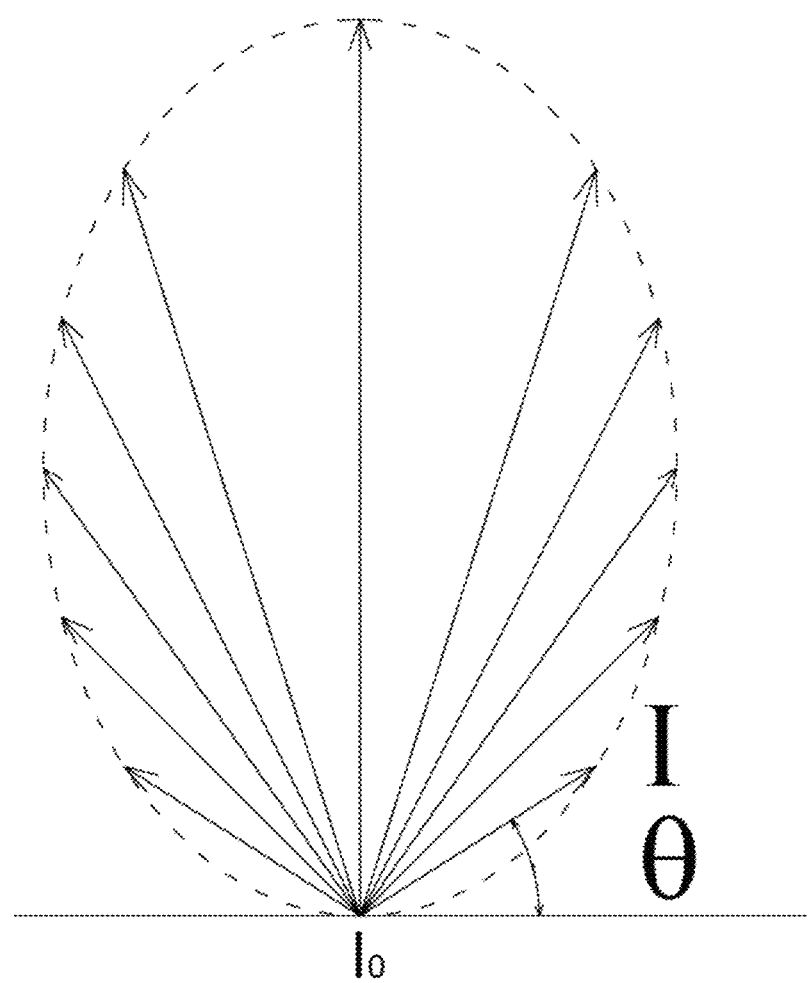
FIG. 1 is a schematic diagram illustrating a distribution pattern of gaseous organic material exited from an outlet of a nozzle.

The distribution of gaseous organic material from the nozzle follows a Maxwell-Boltzmann distribution function. FIG. 1 is a schematic diagram illustrating a distribution pattern of gaseous organic material exited from an outlet of a nozzle. Referring to FIG. 1 the amount of organic material at the opening of a nozzle is denoted as $I_0$. An amount I of organic material distributed at an angle $\theta$ with respect to the surface of the crucible body can be calculated according to an equation $I=I_0 \cos^n \theta$. Thus, it is possible to estimate the thickness of the deposition film and the efficiency of the evaporation by calculating an n value. The n value also partially depends on the size of the opening of the nozzle and a height of the nozzle. When the height of the nozzle is kept the same, the greater the size of the opening, the smaller the n value. When the size of the opening is kept the same, the greater the height of the nozzle, the greater the n value. The smaller the n value, the broader the range of distribution. The greater the n value, the narrower the range of the distribution.

In one example, the correlation between the n value and the size of the opening is illustrated in Table 1. The height of the nozzle is kept at 15 mm.

TABLE 1

| Correlation between the n value and the size of the opening. | | | | |
|---|---|---|---|---|
| Diameter of the opening (mm) | 6 | 8 | 10 | 12 |
| n value | 8 | 6 | 4 | 3 |

In another example, the correlation between the n value and the height of the nozzle is illustrated in Table 2. The diameter of the opening is kept at 10 mm.

TABLE 2

| Correlation between the n value and the height of the nozzle. | | | | |
|---|---|---|---|---|
| Height of the nozzle (mm) | 15 | 18 | 20 | 24 |
| n value | 4.5 | 6.5 | 6.5 | 7.0 |

Figure 2:
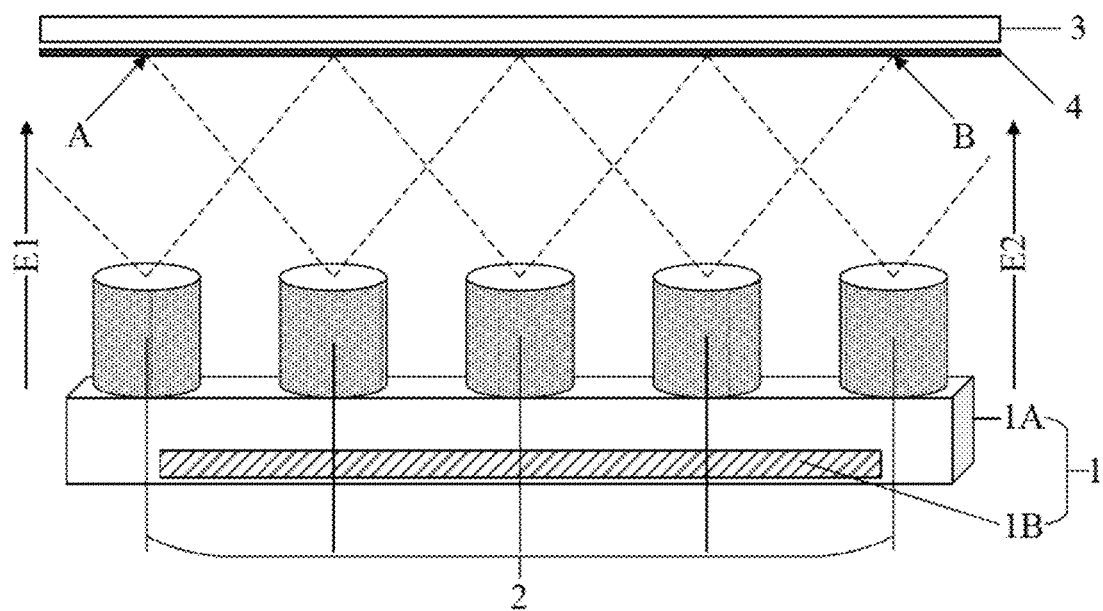
FIG. 2 is a schematic diagram illustrating the structure of a conventional evaporation crucible.

FIG. 2 is a schematic diagram illustrating the structure of a conventional evaporation crucible. Referring to FIG. 2, the conventional evaporation crucible includes a crucible body 1 and a plurality of nozzles 2 connected to the crucible body 1. The plurality of nozzle 2 in the conventional evaporation crucible have a substantially the same shape, dimension, and orientation. The inlet of each of the plurality of nozzles 2 is connected to the interior of the crucible body 1. The outlet of each of the plurality of nozzles 2 passes through an opening on top of the crucible body. The crucible body in some embodiments includes a material chamber 1A and a heater 1B. By heating the material chamber 1A, an organic material (e.g., an organic light emitting material) evaporates into a gaseous organic material. The gaseous organic material enters the inlet of each of the plurality of nozzles 2, and exits the outlet of each of the plurality of nozzles 2. The gaseous organic material exited from the outlet of each of the plurality of nozzles 2 deposits onto a surface of a substrate 3 placed on top of the evaporation crucible.

As shown in FIG. 2, in an area between A and B on the substrate 3, the material deposited on the substrate 3 comes from two adjacent nozzles 2. Outside the area between A and B (e.g., on the left side of A or on the right side of B), the material deposited on the substrate 3 comes from a single nozzle 2. Thus, the deposition film formed in the area between A and B is thicker than that outside of the area between A and B. This edge effect results in a deposition film having non-uniform thickness, i.e., the thickness of the film is smaller along the edges and greater in the center. A non-uniform deposition film (e.g., an organic light emitting layer) adversely affects the display quality.

Accordingly, the present disclosure provides, inter alia, an evaporation crucible and an evaporation apparatus that substantially obviate one or more of the problems due to limitations and disadvantages of the related art. In one aspect, the present disclosure provides an evaporation crucible. In some embodiments, the evaporation crucible includes a crucible body and a plurality of nozzles connected to the crucible body. Each of the plurality of nozzles has an opening on a side distal to the crucible body. The plurality of nozzles includes a first nozzle on a first edge of the plurality of nozzles. The first nozzle has a first height relative to a surface of the crucible body on a side proximal to the first edge greater than a second height relative to the surface of the crucible body on a side distal to the first edge. Using the present evaporation crucible, a highly uniform distribution of organic material and a film deposited on a substrate having highly uniform thickness throughout the film can be achieved.

Figure 3:
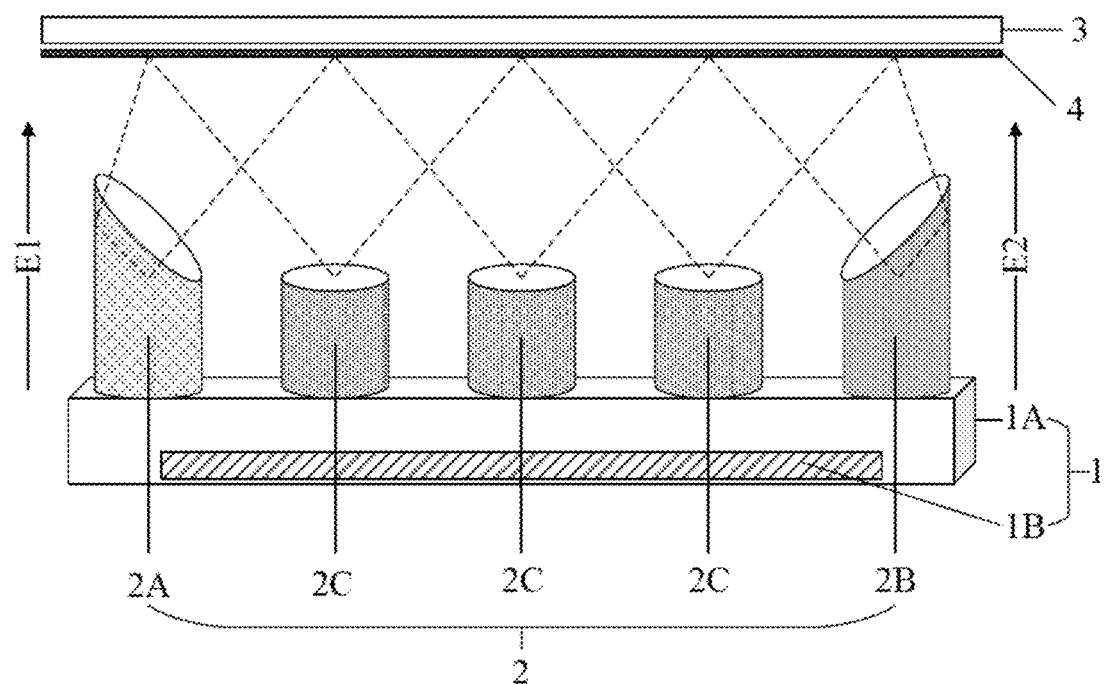
FIG. 3 is a schematic diagram illustrating the structure of an evaporation crucible in some embodiments according to the present disclosure.

FIG. 3 is a schematic diagram illustrating the structure of an evaporation crucible in some embodiments according to the present disclosure. Referring to FIG. 3, the evaporation crucible in some embodiments includes a crucible body 1 and a plurality of nozzles 2 connected to the crucible body 1. The plurality of nozzle 2 includes a first nozzle 2A, a second nozzle 2B, and at least a third nozzle 2C between the first nozzle 2A and the second nozzle 2B. The first nozzle 2A is on a first edge (e.g., a left edge) of the plurality of nozzles 2. The second nozzle 2B is on a second edge (e.g., a right edge) opposite to the first edge of the plurality of nozzles 2. The inlet of each of the plurality of nozzles 2 is connected to the interior of the crucible body 1. The outlet of each of the plurality of nozzles 2 passes through an opening on top of the crucible body. The crucible body in some embodiments includes a material chamber 1A and a heater 1B. The heater 1B may be disposed inside the material chamber 1A. Optionally, the heater 1B is disposed external to the material chamber 1A. By heating the material chamber 1A, an organic material (e.g., an organic light emitting material) evaporates into a gaseous organic material. The gaseous organic material enters the inlet of each of the plurality of nozzles 2, and exits the outlet of each of the plurality of nozzles 2. The gaseous organic material exited from the outlet of each of the plurality of nozzles 2 deposits onto a surface of a substrate 3 placed on top of the evaporation crucible. In some embodiments, the plurality of nozzles 2 are arranged as a row of a plurality of nozzles 2 (as shown in FIG. 3). During the deposition process, the row of the plurality of nozzles 2 and the substrate move relative to each other. The row of the plurality of nozzles 2 scans the surface of the substrate 3, depositing a layer of organic material having substantially uniform thickness on the surface of the substrate 3. In some embodiments, a mask plate 4 is placed between the substrate 3 and the row of the plurality of nozzles 2.

The first nozzle 2A is on a first edge E1 of the plurality of nozzles 2, e.g., the first nozzle 2A is the first one of the plurality of nozzles 2 on the left side. The second nozzle 2B is on a second edge E2 of the plurality of nozzles 2, e.g., the second nozzle 2B is the last one of the plurality of nozzles 2 on the right side. The second edge E2 is opposite to the first edge E1. Thus, in a row of the plurality of nozzles 2, the first nozzle 2A is the first one in the row and the second nozzle 2B is the last in the row.

Figure 4:
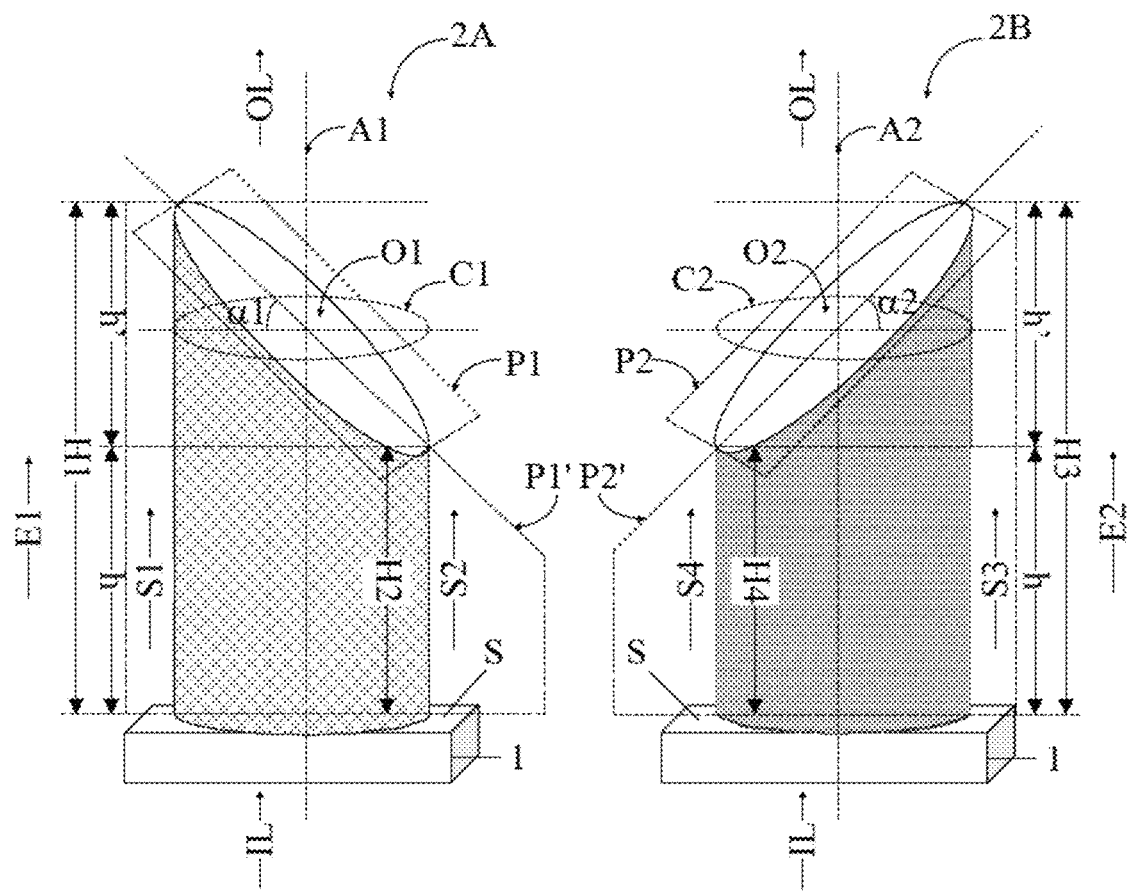
FIG. 4 is a schematic diagram illustrating the structure of a first nozzle and a second nozzle in some embodiments according to the present disclosure.

FIG. 4 is a schematic diagram illustrating the structure of a first nozzle and a second nozzle in some embodiments according to the present disclosure. Referring to FIG. 4, the first nozzle 2A in some embodiments has an inlet IL connected to the interior of the crucible body 1, and an outlet OL passing through an opening on top of the crucible body 1 and allowing the gaseous organic material exiting the crucible body 1. Referring to FIG. 3 and FIG. 4, the first nozzle 2A is on a first edge E1 of the plurality of nozzles 2, e.g., the first nozzle 2A is the first one of the plurality of nozzles 2 on the left side. The first nozzle 2A has a first height H1 relative to a surface S of the crucible body 1 on a first side S1 proximal to the first edge E1, and a second height H2 relative to a surface S of the crucible body 1 on a second side S2 distal to the first edge E1 (and proximal to the second edge E2). The first height H1 is greater than the second height H2. As denoted in FIG. 4, the first height H1 in some embodiments is h+h', and the second height H2 in some embodiments is h. Thus, the first height H1 is greater than the second height H2 by h'. Optionally, the first height H1 is greater than the second height H2 by at least 10%, e.g., by at least 20%, by at least 50%, at least 100%, and so on. Optionally, the first height H1 is a maximal height along the entire edge of the first opening O1. Optionally, the second height H2 is a minimal height along the entire edge of the first opening O1.

By having a first nozzle 2A having a first height H1 relative to a surface S of the crucible body 1 on a first side S1 proximal to the first edge E1 greater than a second height H2 relative to the surface S of the crucible body 1 on a second side S2 distal to the first edge E1, the edge effect of the conventional evaporation crucible is obviated. By having a greater first height H1 on the first side, the n value on the left side of the first nozzle 2A is increased, resulting in a narrower material distribution on the left side of the first nozzle 2A. The narrower distribution on the left side leads to an increased deposition on the left side of the first nozzle 2A, which in turn increases a thickness of the deposition film in this region. By having the second height H2 smaller, e.g., substantially the same as the heights of other nozzles in the middle of the plurality of nozzles 2, the n value of the right side of the first nozzle 2A is maintained substantially the same as the n value for the other nozzles in the middle of the plurality of nozzles 2. Thus, the deposition on the right side of the first nozzle 2A is substantially unchanged. As a result, a substantially uniform thickness on the left side and on the right side of the first nozzle 2A can be achieved.

Referring to FIG. 4, the second nozzle 2B in some embodiments has an inlet IL connected to the interior of the crucible body 1, and an outlet OL passing through an opening on top of the crucible body 1 and allowing the gaseous organic material exiting the crucible body 1. Referring to FIG. 3 and FIG. 4, the second nozzle 2B is on a second edge E2 of the plurality of nozzles 2. e.g., the second nozzle 2B is the last one of the plurality of nozzles 2 on the right side. The second nozzle 2B has a third height H3 relative to a surface S of the crucible body 1 on a third side S3 proximal to the second edge E2, and a fourth height H4 relative to a surface S of the crucible body 1 on a fourth side S4 distal to the second edge E2 (and proximal to the first edge E1) The third height H3 is greater than the fourth height H4. As denoted in FIG. 4, the third height H3 in some embodiments is h+h', and the fourth height H4 in some embodiments is h. Thus, the third height H3 is greater than the fourth height H4 by h'. Optionally, the third height H3 is greater than the fourth height H4 by at least 10%, e.g., by at least 20%, by at least 50%, at least 100%, and so on. Optionally, the third height H3 is a maximal height along the entire edge of the second opening O2. Optionally, the fourth height H4 is a minimal height along the entire edge of the second opening O2.

By having a second nozzle 2B having a third height H3 relative to a surface S of the crucible body 1 on a third side S3 proximal to the second edge E2 greater than a fourth height H4 relative to the surface S of the crucible body 1 on a fourth side S4 distal to the second edge E2, the edge effect of the conventional evaporation crucible is obviated. By having a greater third height H3 on the third side, the n value on the right side of the second nozzle 2B is increased, resulting in a narrower material distribution on the right side of the second nozzle 2B, The narrower distribution on the right side leads to an increased deposition on the right side of the second nozzle 2B, which in turn increases a thickness of the deposition film in this region. By having the fourth height H4 smaller than the third height H3, e.g., the fourth height H4 being substantially the same as the heights of other nozzles in the middle of the plurality of nozzles 2, the n value of the left side of the second nozzle 2B is maintained substantially the same as the n value for the other nozzles in the middle of the plurality of nozzles 2. Thus, the deposition on the left side of the second nozzle 2B is substantially unchanged. As a result, a substantially uniform thickness on the left side and on the right side of the second nozzle 2B can be achieved.

Optionally, the first height H1 and the third height H3 are substantially the same, and the second height H2 and the fourth height H4 are substantially the same.

Referring to FIG. 4, the first nozzle 2A in some embodiments has a first opening O1. The plane P1 of the first opening O1 is inclined with respect to a cross-section C1 of the first nozzle 2A normal to a central axis A1 of the first nozzle 2A. As shown in FIG. 4, the plane P1 of the first opening O1 is inclined with respect to the cross-section C1 of the first nozzle 2A normal to the central axis A1 of the first nozzle 2A at a first angle α1. Optionally, the first angle α1 is in a range of approximately 5 degrees to approximately 85 degrees, e.g., approximately 10 degrees to approximately 80 degrees, approximately 20 degrees to approximately 70 degrees, approximately 30 degrees to approximately 60 degrees, and approximately 40 degrees to approximately 50 degrees.

As used herein, the term "inclined" refers to a situation in which a first plane forms an angle with a second plane, the angle is being not zero and not 90 degrees. Optionally, the first plane is not parallel to the second plane, and is not normal to the second plane.

Referring to FIG. 4, the second nozzle 2B in some embodiments has a second opening O2. The plane P2 of the second opening O2 is inclined with respect to a cross-section C2 of the second nozzle 2B normal to a central axis A2 of the second nozzle 2B. As shown in FIG. 4, the plane P2 of the second opening O2 is inclined with respect to the cross-section C2 of the second nozzle 2B normal to the central axis A2 of the second nozzle 2B at a second angle α2. Optionally, the second angle α2 is in a range of approximately 5 degrees to approximately 85 degrees, e.g., approximately 10 degrees to approximately 80 degrees, approximately 20 degrees to approximately 70 degrees, approximately 30 degrees to approximately 60 degrees, and approximately 40 degrees to approximately 50 degrees.

Optionally, the first angle α1 is substantially the same as the second angle α2.

Referring to FIG. 3 and FIG. 4, in some embodiments, the plane P1 of the first opening O1 and the plane P2 of the second opening O2 are inclined toward each other. The plane P1 of the first opening O1 and the plane P2 of the second opening O2 are on a side of the first opening O1 and the second opening O2 proximal to the crucible body 1. The plane P1' normal to the plane P1 of the first opening O1 and the plane P2' normal to the plane P2 of the second opening O2 are substantially parallel to each other. The plane P1 of the first opening O1 is inclined with respect to the cross-section C1 of the first nozzle 2A normal to the central axis A1 of the first nozzle 2A at a first angle α1. The plane P2 of the second opening O2 is inclined with respect to the cross-section C2 of the second nozzle 2B normal to the central axis A2 of the second nozzle 2B at a second angle α2. Optionally, the first angle α1 is in a range of approximately 10 degrees to approximately 80 degrees. Optionally, the second angle α2 is in a range of approximately 10 degrees to approximately 80 degrees. Optionally, the first angle α1 and the second angle α2 are substantially the same.

Figure 5:
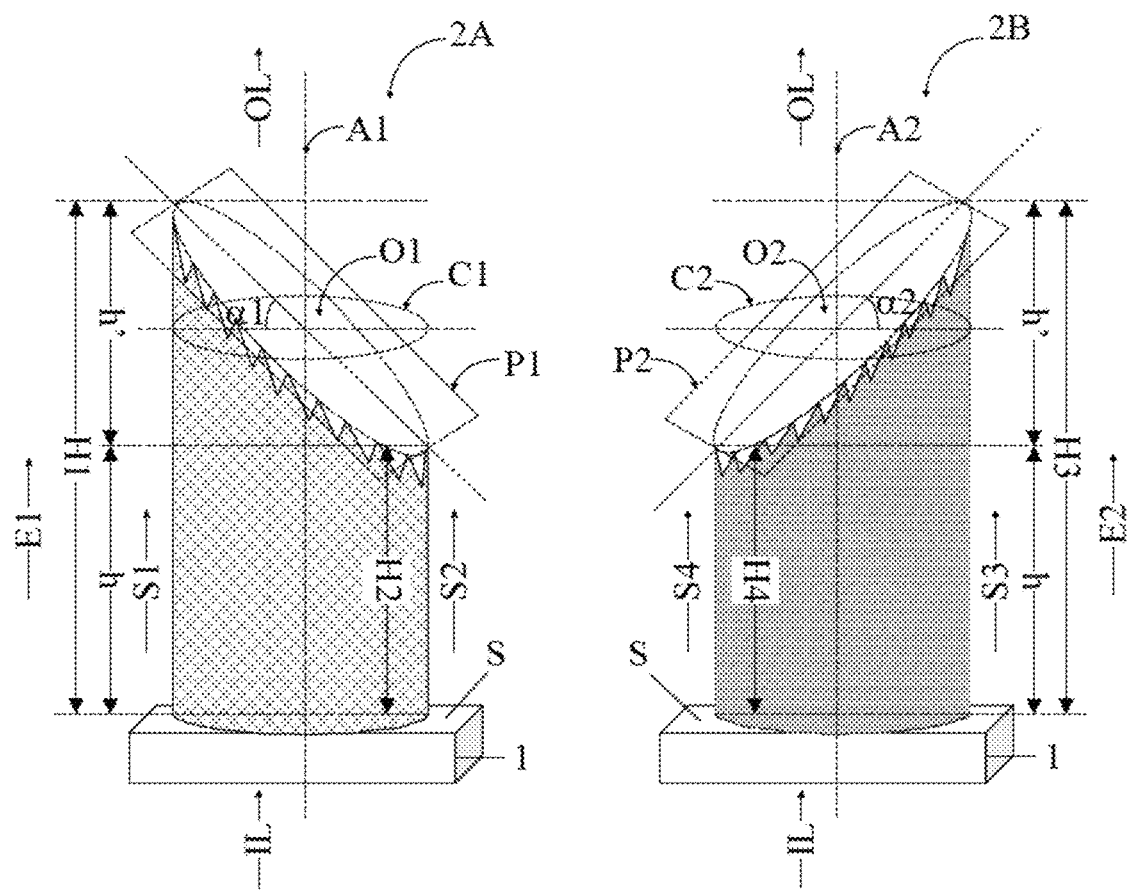
FIG. 5 is a schematic diagram illustrating the structure of a first nozzle and a second nozzle in some embodiments according to the present disclosure.
Figure 6:
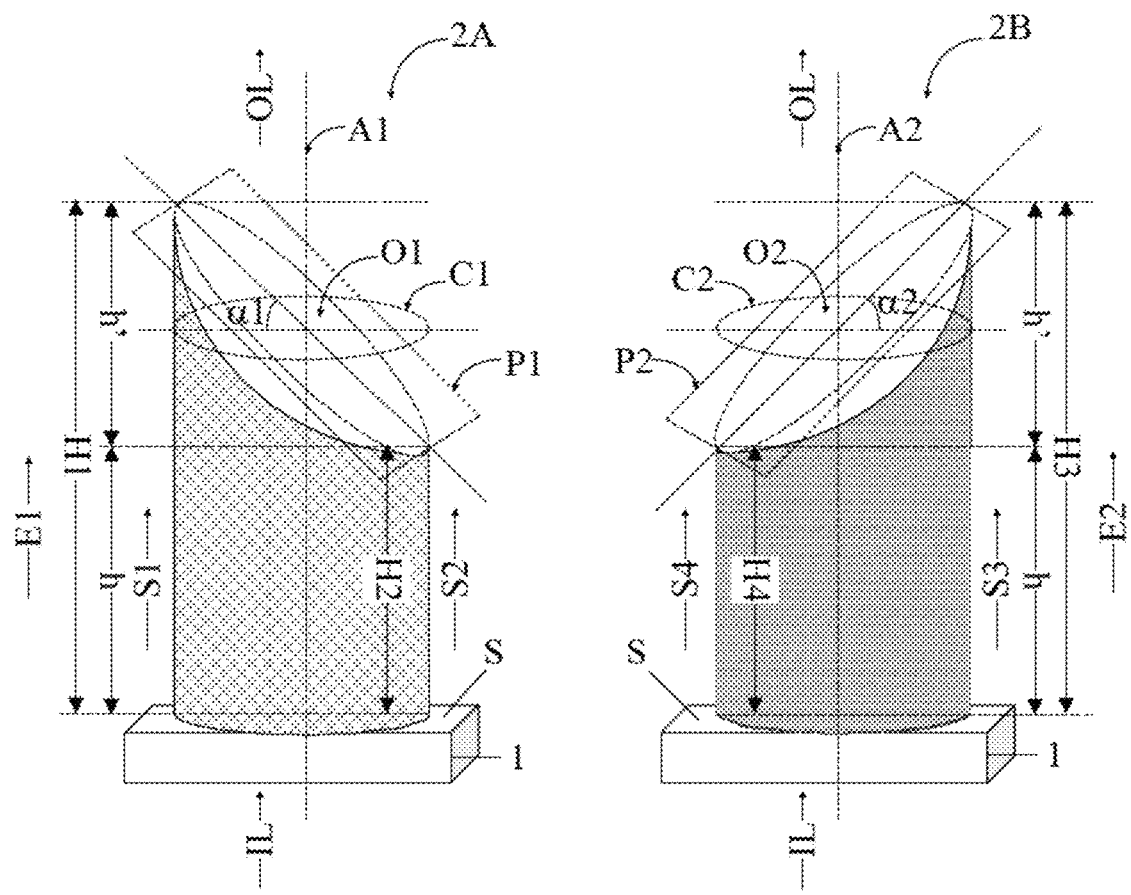
FIG. 6 is a schematic diagram illustrating the structure of a first nozzle and a second nozzle in some embodiments according to the present disclosure.

In the context of the present disclosure, the plane of an opening refers to a plane in contact with a plurality of points along the edge of the opening. The first opening O1 and the second opening O2 in FIG. 4 have a substantially smooth edge and the entire edge has a substantially the same slope. In some embodiments, the opening need not have a smooth edge, nor an edge having a substantially the same slope along its entire path. Optionally, the plane of an opening is a plane that is in contact with a plurality of points along the edge of the opening, and has a slope substantially the same as the average slope along the edge of the opening. FIG. 5 is a schematic diagram illustrating the structure of a first nozzle and a second nozzle in some embodiments according to the present disclosure. Referring to FIG. 5, the first nozzle 2A and the second nozzle 2B are substantially the same as those in FIG. 4 except that the first opening O1 and the second opening O2 have a serrated or jagged edge. The plane P1 of the first opening O1 is a plane in contact with a plurality of points along the edge of the first opening O1, and has a slope substantially the same as the average slope of the along the edge of the first opening O1. The plane P2 of the second opening O2 is a plane in contact with a plurality of points along the edge of the second opening O2, and has a slope substantially the same as the average slope of the along the edge of the second opening O2. FIG. 6 is a schematic diagram illustrating the structure of a first nozzle and a second nozzle in some embodiments according to the present disclosure. Referring to FIG. 6, the first nozzle 2A and the second nozzle 2B are substantially the same as those in FIG. 4 except that the first opening O1 and the second opening O2 both have a concave shape. The edges of the first opening O1 and the second opening O2 both have variable slopes along then edges. The plane P1 of the first opening O1 is a plane in contact with a plurality of points along the edge of the first opening O1, and has a slope substantially the same as the average slope of the along the edge of the first opening O1. The plane P2 of the second opening O2 is a plane in contact with a plurality of points along the edge of the second opening O2, and has a slope substantially the same as the average slope of the along the edge of the second opening O2.

Figure 7:
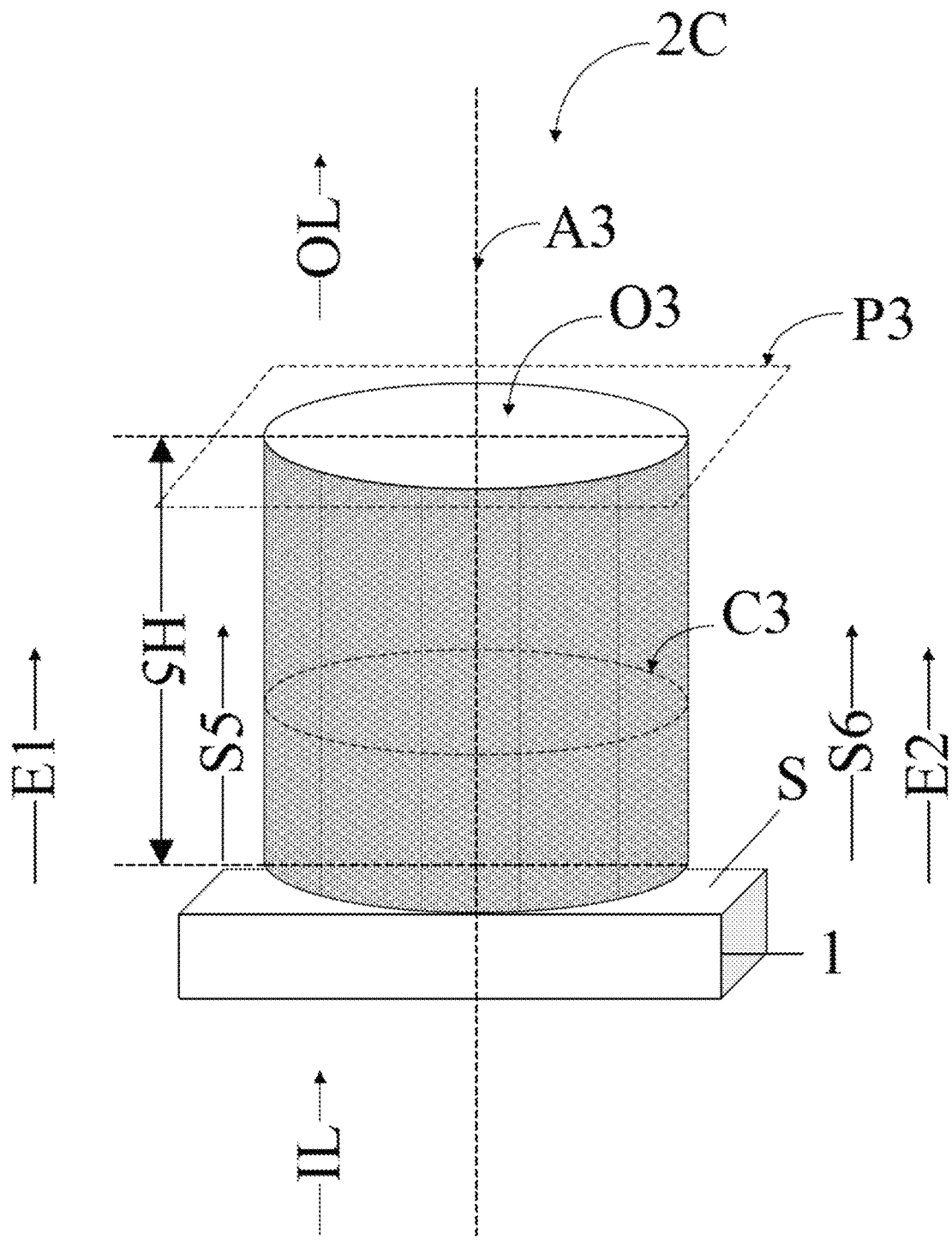
FIG. 7 is a schematic diagram illustrating the structure of a third nozzle in some embodiments according to the present disclosure.

In some embodiments, the plurality of nozzles includes at least a third nozzle between the first nozzle and the second nozzle. FIG. 7 is a schematic diagram illustrating the structure of a third nozzle in some embodiments according to the present disclosure. Referring to FIG. 7, the third nozzle 2C has a substantially the same a fifth height H5 relative to the surface S of the crucible body 1 on a fifth side S5 proximal to the first edge E1 and on a sixth side S6 proximal to the second edge E2. Optionally, the fifth height H5 is h. Referring to FIG. 4 and FIG. 7, in some embodiments, the second height H2 of the first nozzle 2A, the fourth height H4 of the second nozzle 2B, and the fifth height H5 of the third nozzle 2C are substantially the same. Optionally, the third height H3 of the second nozzle 2B is substantially the same as the first height H1 of the first nozzle 2A.

Referring to FIG. 7, in some embodiments, the third nozzle 2C includes a third opening O3. Optionally, the third nozzle 2C has a substantially uniform height along the entire edge of the third opening O3. A plane P3 of the third opening O3 is substantially normal to a central axis A3 of the third nozzle 2C, i.e., the plane P3 of the third opening O3 is substantially parallel to a cross-section C3 normal to the central axis A3.

Referring to FIG. 3 and FIG. 7, in some embodiments, each nozzle between the first nozzle 2A and the second nozzle 2B is a third nozzle 2C. Each third nozzle 2C of the plurality of third nozzles between the first nozzle 2A and the second nozzle 2B has a substantially the same a fifth height H5 relative to the surface S of the crucible body 1 on a fifth side S5 proximal to the first edge E1 and on a sixth side S6 proximal to the second edge E2. Optionally, the fifth height H5 is h. Referring to FIGS. 3, 4, and 7, in some embodiments, the second height H2 of the first nozzle 2A, the fourth height H4 of the second nozzle 2B, and the fifth height H5 of each third nozzle 2C of the plurality of third nozzles are substantially the same. Optionally, the third height H3 of the second nozzle 2B is substantially the same as the first height H1 of the first nozzle 2A. Optionally, each third nozzle 2C of the plurality of third nozzles has a third opening O3. Optionally, each third nozzle 2C of the plurality of third nozzles has a substantially uniform height along the entire edge of the third opening O3. Optionally, a plane P3 of the third opening O3 is substantially normal to a central axis A3 of the third nozzle 2C, i.e., the plane P3 of the third opening O3 is substantially parallel to a cross-section CS normal to the central axis A3.

Figure 8:
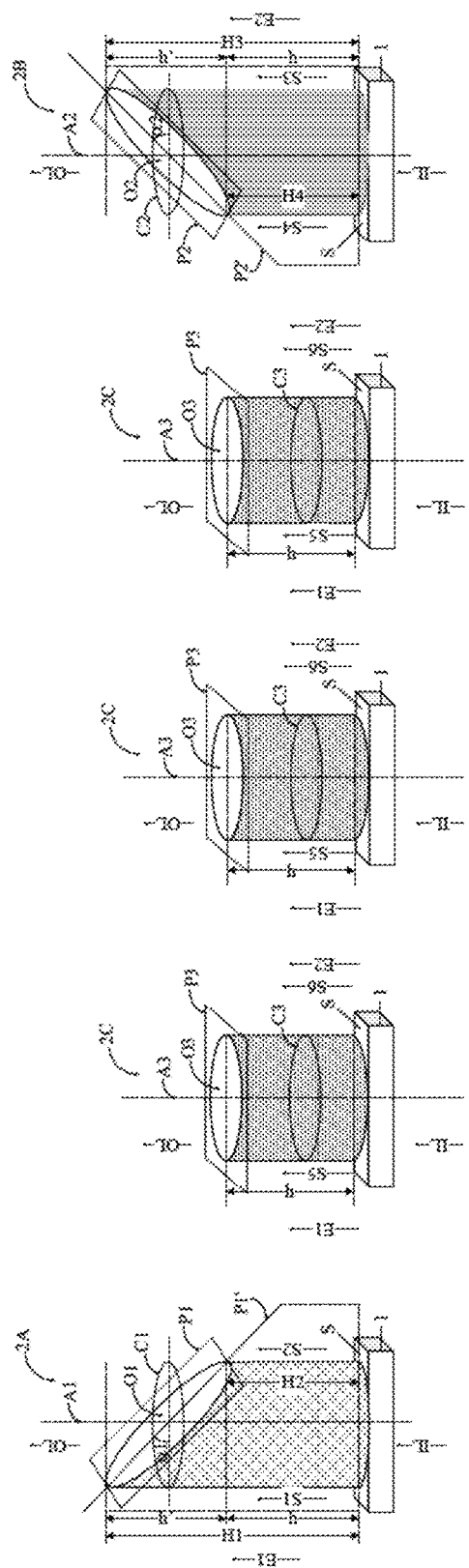
FIG. 8 is a schematic diagram illustrating the structure of a first nozzle, a second nozzle, and a plurality of third nozzles in some embodiments according to the present disclosure.

FIG. 8 is a schematic diagram illustrating the structure of a first nozzle, a second nozzle, and a plurality of third nozzles in some embodiments according to the present disclosure. Referring to FIG. 8, a plane P3 of an opening O3 of any third nozzle 2C between the first nozzle 2A and the second nozzle 2B is substantially normal to its central axis A3. A plane P1' normal to the plane P1 of the first opening O1 and a plane P2' normal to the plane P2 of the second opening O2 are substantially parallel to each other, and substantially parallel to the central axes A3 of nozzles between the first nozzle 2A and the second nozzle 2B. Optionally, a pattern of a projection of the first opening O1 on the plane P1 has a mirror symmetry with respect to the plane P1', and a pattern of a projection of the second opening O2 on the plane P2 has a mirror symmetry with respect to the plane P2'. Optionally, the plane P1', the plane P2', and the central axes A3 are substantially co-planar, as shown in FIG. 8.

Figure 9:
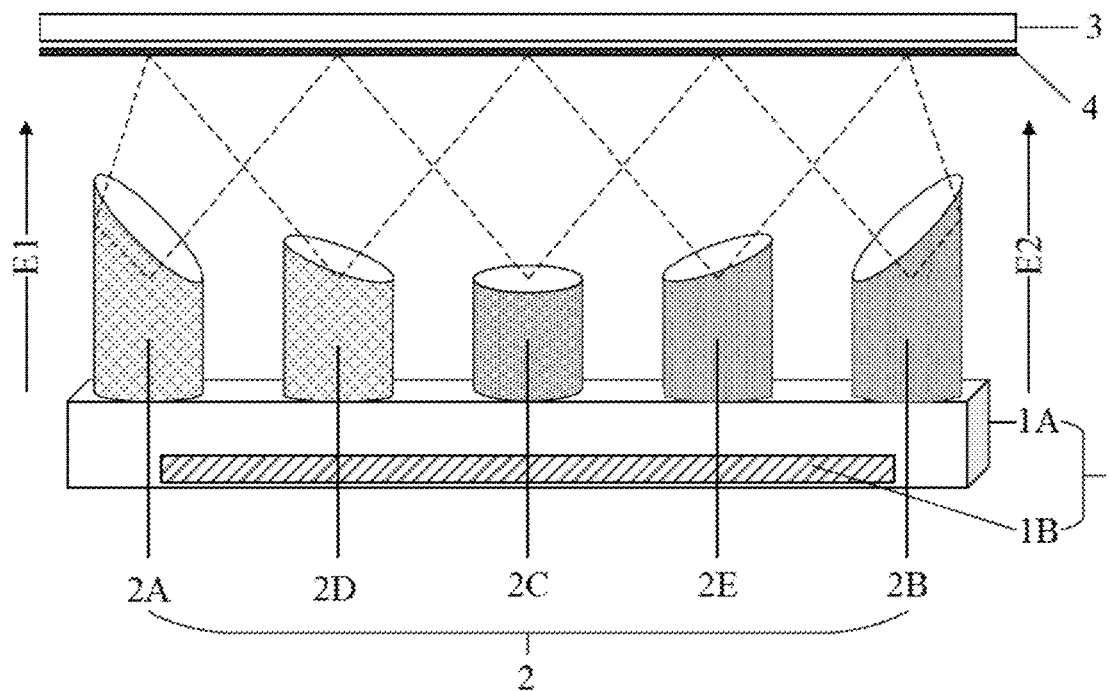
FIG. 9 is a schematic diagram illustrating the structure of an evaporation crucible in some embodiments according to the present disclosure.

In some embodiments, between the first nozzle on the first edge and the second nozzle on the second edge, the plurality of nozzles further includes nozzles different from the third nozzle, e.g., not every nozzle between the first nozzle and the second nozzle is a third nozzle. FIG. 9 is a schematic diagram illustrating the structure of an evaporation crucible in some embodiments according to the present disclosure. Referring to FIG. 9, in some embodiments, the plurality of nozzles 2 includes a first nozzle 2A on a first edge E1 of the plurality of nozzles 2, a second nozzle 2B on a second edge E2 of the plurality of nozzles 2, one or more third nozzle 2C between the first nozzle 2A and the second nozzle 2B, a fourth nozzle 2D adjacent to the first nozzle 2A, and a fifth nozzle 2E adjacent to the second nozzle 2B. Similar to the first nozzle 2A, the fourth nozzle 2D also has a height relative to a surface of the crucible body 1 on a side proximal to the first edge E1 greater than that on a side distal to the first edge E1. However, the height ratio between the height on the side proximal to the first edge E1 and the height on the side distal to the first edge E1 for the fourth nozzle 2D is less than that for the first nozzle 2A. Similar to the second nozzle 2B, the fifth nozzle 2E also has a height relative to the surface of the crucible body 1 on a side proximal to the second edge E2 greater than that on a side distal to the second edge E2. The height ratio between the height on the side proximal to the second edge E2 and the height on the side distal to the second edge E2 for the fifth nozzle 2E is less than that for the second nozzle 2B.

Referring to FIG. 8, in some embodiments, central axes of all of the plurality of nozzles 2, e.g., the central axes A1, A2, and A3, are all substantially parallel to each other. Optionally, each of the plurality of nozzles 2 has a cross-section normal to its central axis. The cross-sections of all of the plurality of nozzles 2, e.g., C1, C2, and C3, all have a substantially the same area. As shown in FIG. 8, each of the plurality of nozzles 2 has a single opening. Optionally, a projection of each of all of the plurality of nozzles 2 on the crucible body 1 has a substantially the same shape and a substantially the same area. Optionally, the projection of each of the plurality of nozzles 2 on the crucible body has a circular shape.

Figure 10:
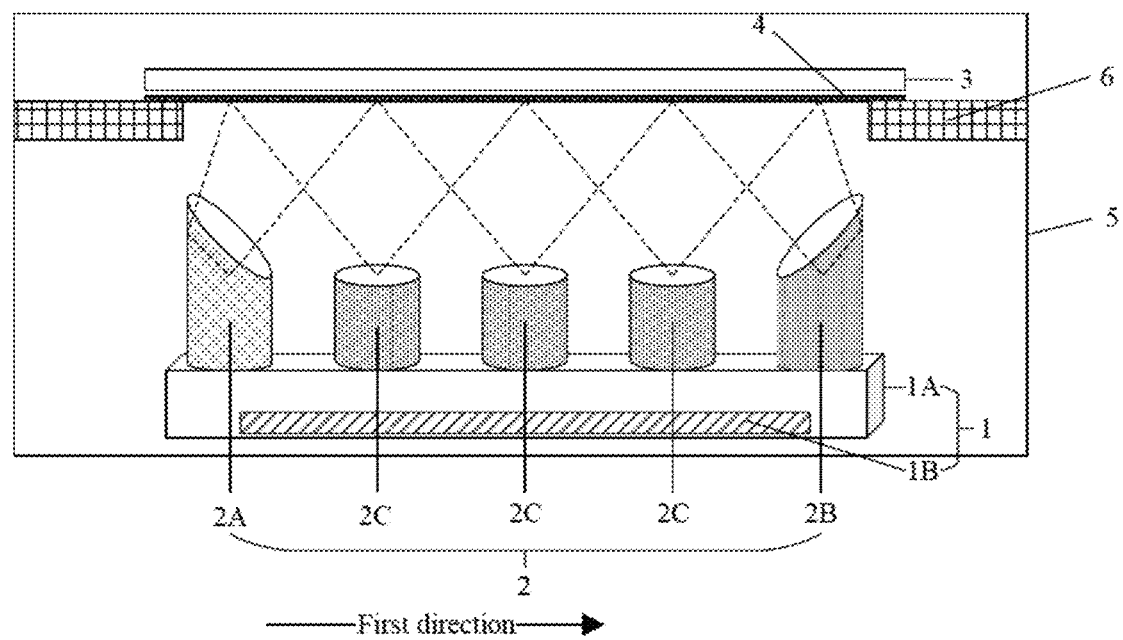
FIG. 10 is a schematic diagram illustrating the structure of an evaporation apparatus in some embodiments according to the present disclosure.

In another aspect, the present disclosure provides an evaporation apparatus having a evaporation crucible described herein. FIG. 10 is a schematic diagram illustrating the structure of an evaporation apparatus in some embodiments according to the present disclosure. Referring to FIG. 10, the evaporation apparatus in some embodiments includes a housing 5 and a transporting apparatus 6 in the housing 5. The transporting apparatus 6 is disposed above the evaporation crucible, which includes the crucible body 1 and a plurality of nozzles 2. The transporting apparatus 6 is configured to support a substrate 3 for receiving a vapor evaporated from the plurality of nozzles 2 of the evaporation crucible. Optionally, a mask plate 4 is placed between the substrate 3 and the plurality of nozzles 2. Optionally, the plurality of nozzles 2 are substantially arranged along a first direction, and the transporting apparatus 6 is configured to move the substrate 3 in a direction substantially perpendicular to the first direction.

Various appropriate transporting apparatuses may be used in the present evaporation apparatus. Optionally, the transporting apparatus is a conveying belt. When the substrate 3 is moved to a position opposite to the plurality of nozzles 2, the plurality of nozzles 2 sprays the gaseous organic material to allow the organic material deposited to the substrate 3.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention, be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An evaporation crucible, comprising:
a crucible body; and
a plurality of nozzles connected to the crucible body, each of which has an opening on a side distal to the crucible body;
wherein the plurality of nozzles comprises a first nozzle on a first edge of the plurality of nozzles, and a second nozzle on a second edge of the plurality of nozzles, the second edge being opposite to the first edge;
the first nozzle has a first height relative to a surface of the crucible body on a side proximal to the first edge greater than a second height relative to the surface of the crucible body on a side distal to the first edge;
the opening of the first nozzle is a first opening;
the opening of the second nozzle is a second opening; and
the first opening and the second opening have a serrated or jagged edge;
wherein a plane of the first opening is inclined with respect to a cross-section of the first nozzle normal to a central axis of the first nozzle at a first angle in a range of approximately 5 degrees to approximately 85 degrees; and
the plane of the first opening is a plane in contact with a plurality of points along an edge of the first opening, and has a slope substantially the same as an average slope of the first nozzle along the edge of the first opening.

2. The evaporation crucible of claim 1, wherein the second nozzle has a third height relative to the surface of the crucible body on a side proximal to the second edge greater than a fourth height relative to the surface of the crucible body on a side distal to the second edge.

3. The evaporation crucible of claim 2, wherein the third height is substantially the same as the first height; and
the fourth height is substantially the same as the second height.

4. The evaporation crucible of claim 2, wherein the plurality of nozzles includes at least a third nozzle between the first nozzle and the second nozzle;
the third nozzle has a substantially the same a fifth height relative to the surface of the crucible body on a side proximal to the first edge and on a side proximal to the second edge;
the second height, the fourth height and the fifth height are substantially the same; and
the third height is substantially the same as the first height.

5. The evaporation crucible of claim 4, wherein the opening of the third nozzle is a third opening; and
the third nozzle has a substantially uniform height along an edge of the third opening.

6. The evaporation crucible of claim 4, wherein the opening of the third nozzle is a third opening; and
a plane of the third opening is substantially normal to a central axis of the third nozzle.

7. The evaporation crucible of claim 2, wherein any nozzle between the first nozzle and the second nozzle has a substantially the same a sixth height relative to the surface of the crucible body on a side proximal to the first edge and on a side proximal to the second edge;
the second height, the fourth height and the sixth height are substantially the same; and
the third height is substantially the same as the first height.

8. The evaporation crucible of claim 7, wherein a plane of an opening of any nozzle between the first nozzle and the second nozzle is substantially normal to its central axis; and
a plane normal to the plane of the first opening and a plane normal to the plane of the second opening are substantially parallel to each other, and substantially parallel to central axes of nozzles between the first nozzle and the second nozzle.

9. The evaporation crucible of claim 2, wherein the third height is a maximal height along an edge of the second opening; and
the fourth height is a minimal height along the edge of the second opening.

10. The evaporation crucible of claim 1, wherein a plane of the second opening is inclined with respect to a cross-section of the second nozzle normal to a central axis of the second nozzle at a second angle in a range of approximately 5 degrees to approximately 85 degrees; and
the plane of the second opening is a plane in contact with a plurality of points along an edge of the second opening, and has a slope substantially the same as the average slope of the second nozzle along the edge of the second opening.

11. The evaporation crucible of claim 1, wherein
a plane of the first opening and a plane of the second opening are inclined toward each other so that the plane of the first opening and the plane of the second opening intersect on a side of the first opening and the second opening proximal to the crucible body;
a plane normal to the plane of the first opening and a plane normal to the plane of the second opening are substantially parallel to each other;
the plane of the second opening is inclined with respect to a cross-section of the second nozzle normal to a central axis of the second nozzle at a second angle in a range of approximately 5 degrees to approximately 85 degrees; and
the first angle and the second angle are substantially the same.

12. The evaporation crucible of claim 1, wherein the first height is a maximal height along the edge of the first opening; and
the second height is a minimal height along the edge of the first opening.

13. The evaporation crucible of claim 1, wherein the plurality of nozzles further comprises a middle nozzle between the first nozzle and the second nozzle;
the second nozzle has a third height relative to the surface of the crucible body on a side proximal to the second edge greater than a fourth height relative to the surface of the crucible body on a side distal to the second edge;
a plane of the first opening and a plane of the second opening are inclined toward each other; and
planes of openings of any nozzles between the first nozzle and the middle nozzle are not inclined toward the first opening, and planes of openings of any nozzle between the middle nozzle and the second nozzle are not inclined toward the first opening.

14. The evaporation crucible of claim 1, wherein each of the plurality of nozzles has a cross-section normal to its central axis; and the cross-section of each of the plurality of nozzles has a substantially the same area.

15. The evaporation crucible of claim 1, wherein each of the plurality of nozzles comprises a single opening.

16. The evaporation crucible of claim 1, wherein a projection of each of the plurality of nozzles on the crucible body has a substantially the same shape and a substantially the same area.

17. The evaporation crucible of claim 1, wherein a projection of each of the plurality of nozzles on the crucible body has a circular shape.

18. An evaporation apparatus, comprising the evaporation crucible of claim 1, a housing and a transporting apparatus in the housing;
   wherein the transporting apparatus is above the evaporation crucible and configured to support a substrate for receiving a vapor evaporated from the plurality of nozzles of the evaporation crucible;
   the plurality of nozzles are substantially arranged along a first direction; and
   the transporting apparatus is configured to move the substrate in a direction substantially perpendicular to the first direction.

19. The evaporation crucible of claim 1, wherein the plurality of nozzles further comprises a middle nozzle between the first nozzle and the second nozzle;
   the second nozzle has a third height relative to the surface of the crucible body on a side proximal to the second edge greater than a fourth height relative to the surface of the crucible body on a side distal to the second edge;
   a plane of the first opening and a plane of the second opening are inclined toward each other; and
   planes of openings of any nozzles between the first nozzle and the second nozzle are consistently oriented toward a same direction along central axes of the plurality of nozzles away from the crucible body.

* * * * *